United States Patent [19]

Koike

[11] Patent Number: 5,202,854
[45] Date of Patent: Apr. 13, 1993

[54] SEMICONDUCTOR MEMORY CIRCUIT
[75] Inventor: Hiroki Koike, Tokyo, Japan
[73] Assignee: NEC Corporation, Tokyo, Japan
[21] Appl. No.: 755,229
[22] Filed: Sep. 5, 1991
[30] Foreign Application Priority Data
  Sep. 5, 1990 [JP] Japan .................. 2-234808
[51] Int. Cl.$^5$ .................................. G11C 7/00
[52] U.S. Cl. .......................... 365/203; 365/149; 365/205
[58] Field of Search .............. 365/149, 203, 205, 207, 365/208

[56] References Cited
U.S. PATENT DOCUMENTS
4,803,664  2/1989  Itoh .................. 365/203 X
4,943,944  7/1990  Sakui et al. ........... 365/203 X OTHER PUBLICATIONS
Toshio Takeshima et al., Session 16: Dynamic RAMs, FAM 16:5: A55ns 16Mb DRAM, Digest of Technical Papers of 1989 International Solid State Circuit Conference (ISSCC), pp. 246–247.

Primary Examiner—Joseph A. Popek
Attorney, Agent, or Firm—Sughrue, Mion, Zinn, Macpeak & Seas

[57] ABSTRACT

A semiconductor memory circuit includes bit lines, word lines, memory cells, transfer gates, a sense amplifier, a precharge circuit and a control section. The transfer gates between the bit lines and the sense amplifier are non-conductive during the standby state of the memory. For reading-out data from the memory cell, the transfer gates are made conductive and thereafter the potential of the word line for the memory cell to be selected is raised to its high level, so that the data stored in the memory cell is read out on the bit line. Then, after the transfer gates are made non-conductive, the sense amplifier is activated. In this way, the coupling noise occuring when the transfer gates are made conductive before the level of the word lines become high and the coupling noise occuring when the transfer gates are made non-conductive after the level of the word lines become high cancel each other and, as a result, the voltage loss in the reading out of data from the memory can be eliminated.

2 Claims, 5 Drawing Sheets

SEMICONDUCTOR MEMORY CIRCUIT

BACKGROUND OF THE INVENTION

The present invention relates to a semiconductor memory circuit and, more particularly, to a semiconductor memory circuit equipped with a sense amplifier for amplifying signals between bit lines.

A conventional semiconductor memory circuit of the kind to which the invention relates may be found, for example, in Digest of Technical Papers of 1989 International Solid State Circuit Conference (ISSCC), page 246 which discloses a circuit of latch sense type.

An example of such conventional circuit is one on which a circuit of the above latch sense type is applied to a dynamic random access memory (DRAM) and which includes a plurality of memory cells, each memory cell being of an ordinary type having one transistor and one capacitor. That is, the type in which there is a switching transistor between a capacitor for storing charge and a bit line. There are problem in such a conventional circuit in that, when a transfer signal changes from its high level to its low level thereby causing transfer gates to become non-conductive, the effective read-out voltage inevitably becomes small due to the coupling noise occurring between the gate capacitances of these transfer gates and parasitic capacitances. The details of such a conventional circuit and the problems therein will fully be explained later.

SUMMARY OF THE INVENTION

An object of the present invention is to provide a semiconductor memory circuit equipped with a sense amplifier for amplifying between bit lines.

The invention aims at eliminating such voltage loss as that caused by the coupling noise thereby enabling to increase an operational margin and at providing a semiconductor memory circuit in which a high speed operation of the sense amplifier is not influenced.

In accordance with one aspect of the invention, there is provided a semiconductor memory circuit which comprises:

a first bit line and a second bit line:

a plurality of first word lines and a plurality of second word lines;

a plurality of first memory cells which are respectively connected to the first word lines and the first bit line and which communicate memory data with the first bit line when the first word lines are of a selecting level;

a plurality of second memory cells which are respectively connected to the second word lines and the second bit line and which communicate memory data with the second bit line when the second word lines are of a selecting level;

a first transfer gate and a second transfer gate whose each one end is correspondingly connected to each of the first bit line and the second bit line and which are switched ON and OFF in response to a transfer signal;

a sense amplifier whose first and second input-output terminals are respectively and correspondingly connected to the other ends of the first and second transfer gates and which are activated for amplifying signals between the first and second input-output terminals when an activating signal is at an active level;

a precharge circuit which precharges the first and second input-output terminals of the sense amplifier to a predetermined level when a precharge signal is at an active level; and a control section which sets the transfer signal to its active level thereby turning the first and second transfer gates to their ON-states after the precharge signal has been changed from its active level to its non-active level, which sets a predetermined word line of the plurality of first and second word lines to its selecting level after the transfer signal has been changed to its active level, which sets the transfer signal to its non-active level thereby turning the first and second transfer gates to their OFF-states after the predetermined word line has been changed to its selecting level, and which sets the activating signal to its active level after the transfer signal has been changed to its non-active level.

The semiconductor memory circuit of the invention may comprise another precharge circuit which applies the precharge voltage directly to the first and second bit lines.

According to the present invention, firstly, the transfer gates between the lines and the sense amplifier are non-conductive during the standby state of the memory. For reading out data from a given memory cell, the transfer gates are made conductive and then the potential of the word line for the memory cell to be selected is raised to its high level, so that the data stored in such memory cell is read out on the bit line. Then, after the transfer gates are made non-conductive, the sense amplifier is activated. In this way, the coupling noise occurring when the transfer gates are made conductive before the level of the word line becomes high and the coupling noise occurring when the transfer gates are made non-conductive after the level of the word line becomes high cancel each other and, as a result, the voltage loss in the reading out of the data from the memory cell can be eliminated.

BRIEF DESCRIPTION OF THE DRAWINGS

The above and other objects, features and advantages of the present invention will be apparent from the following description of preferred embodiments of the invention explained with reference to the accompanying drawings, in which:-

DESCRIPTION OF THE PREFERRED EMBODIMENTS

Throughout the following explanation, similar reference symbols or numerals refer to the same or similar elements in all the figures of the drawings.

For the purpose of assisting in the understanding of the present invention, a conventional semiconductor memory circuit will be described by making reference to FIGS. 1 and 2 before the present invention is explained.

Figure 1:
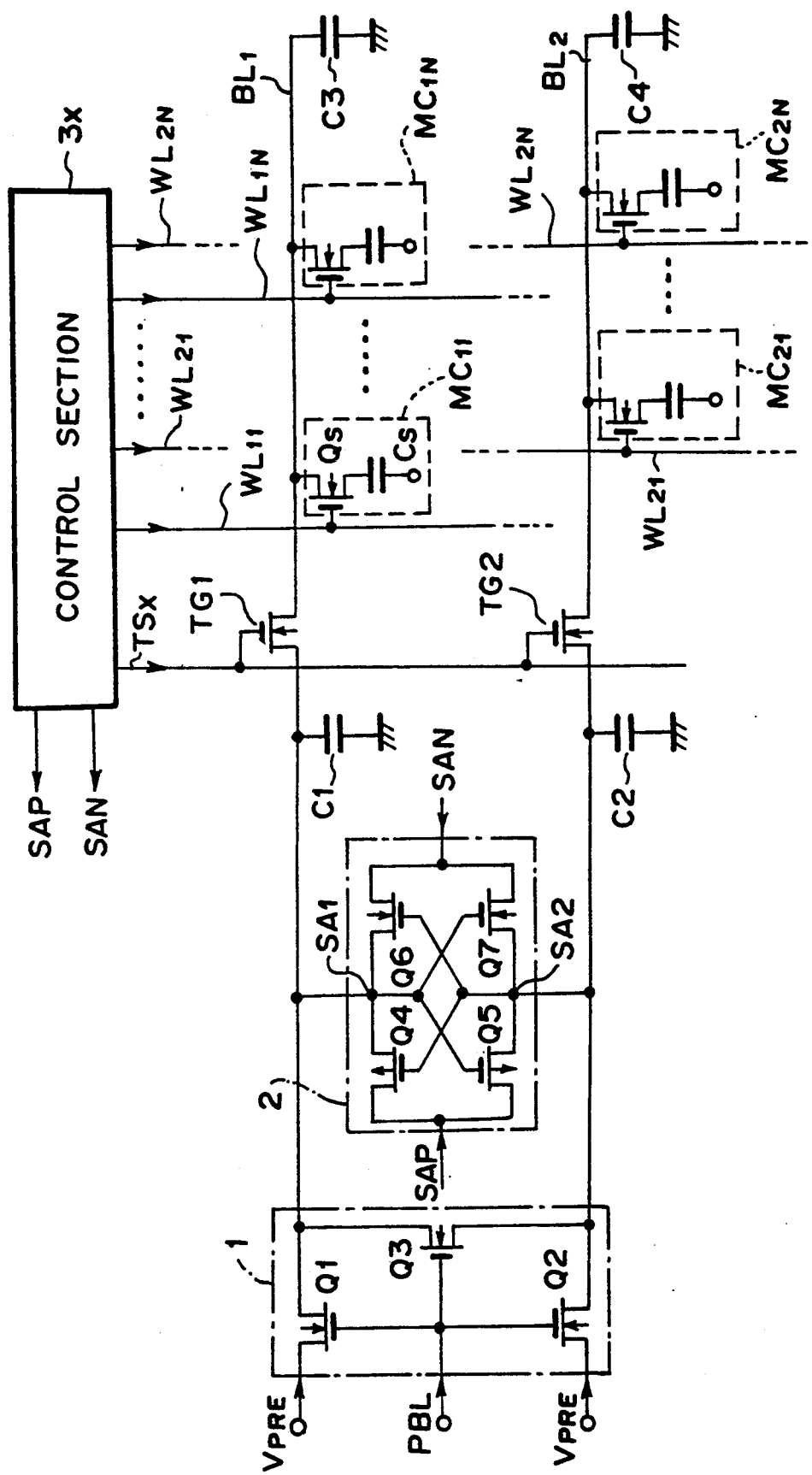
FIG. 1 is a circuit diagram showing a conventional circuit.

FIG. 1 shows an example of a conventional memory circuit in which the latch sense type is applied to a dynamic random access memory (DRAM).

In FIG. 1, the circuit includes a plurality of memory cells $MC_{11} \sim MC_{1N}$, $MC_{21} \sim MC_{2N}$, each memory cell being of an ordinary type having one transistor and one capacitor. That is, the type in which there is a switching transistor $Q_S$ between a capacitor $C_S$ for storing charge and a bit line $BL_1$ or a bit line $BL_2$.

When data is to be read out from the memory cell $MC_{11} \sim MC_{1N}$, $MC_{21} \sim MC_{2N}$, either of word lines $WL_{11} \sim WL_{1N}$ and word lines $WL_{21} \sim WL_{2N}$ is made a high level as a selecting level thereby causing the switching transistor $Q_S$ to become conductive and the charge stored in the relevant capacitor $C_S$ to be supplied to the bit line ($BL_1$, $BL_2$). Thereafter, the sense amplifier 2 amplifies the signal read out from the memory cell.

The sense amplifier 2 is of a CMOS flip-flop type, composed of P-channel transistors Q4, Q5 and N-channel transistors Q6, Q7. Here, it is assumed that activating signals SAP, SAN, are to be applied to a common source terminal of the P-channel transistors Q4, Q5 and a common source terminal of the N-channel transistors Q6, Q7, respectively, of the sense amplifier 2. Also, drain terminals where the P-channel transistors and the N-channel transistors are connected together are made input-output terminals SA1 and SA2.

In the circuit of latch sense type, inserted between the input-output terminals SA1, SA2 and the bit lines $BL_1$, $BL_2$ are transfer gates TG1 and TG2 each having a gate to which a transfer signal TSx is inputted. Capacitors C1, C2, C3 and C4 respectively represent parasitic capacitances of the input-output terminals SA1, SA2 and the bit lines $BL_1$, $BL_2$. Transistors Q1~Q3 form a precharge circuit 1. The precharging of the sense amplifier 2 and the bit lines $BL_1$, $BL_2$ is controlled by a precharge signal PBL applied to each gate of the transistors Q1~Q3. Each of the above elements or the circuits is controlled by a control section 3x.

Figure 2:
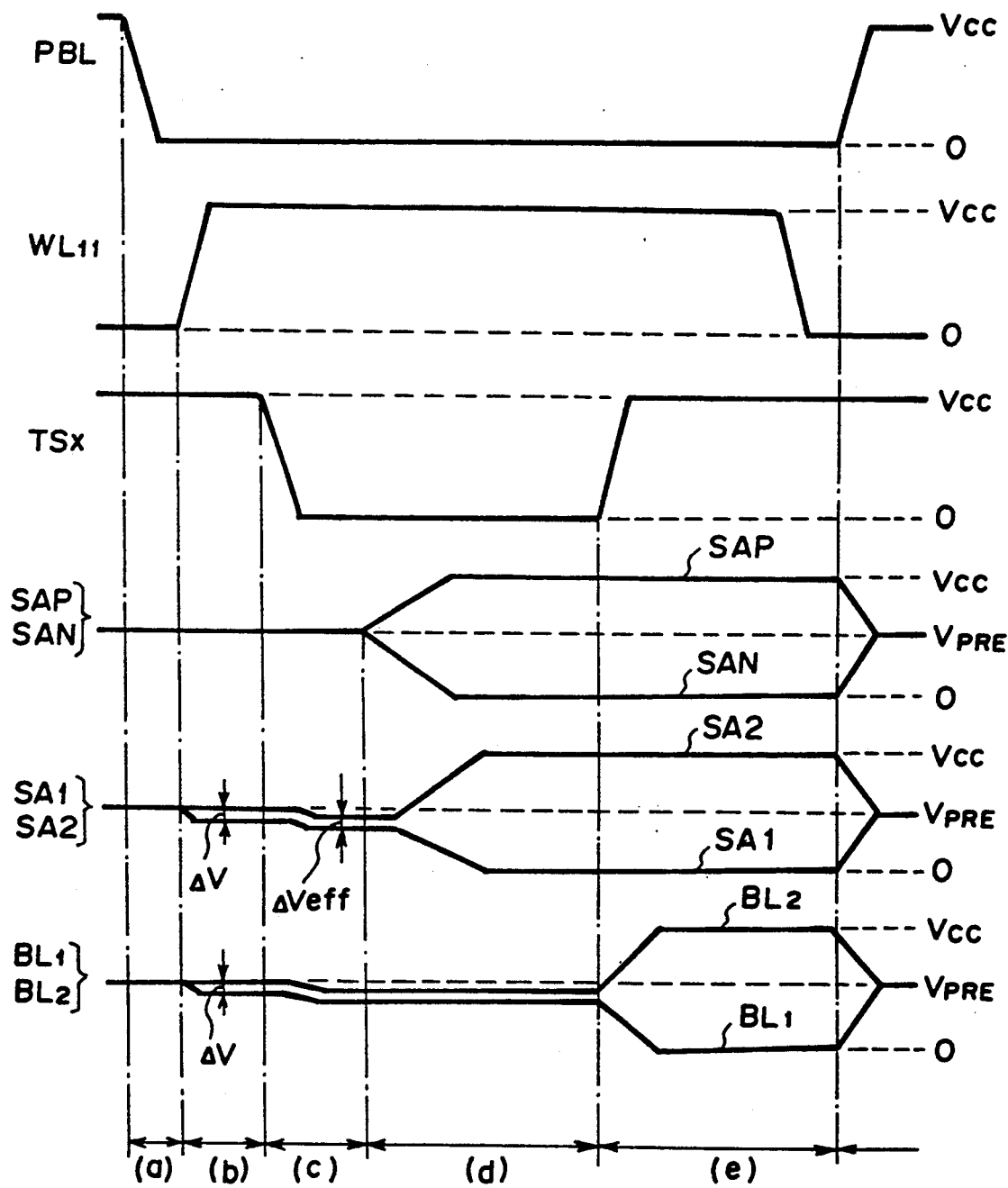
FIG. 2 is a timing chart showing various signal waveforms for illustrating the operation of the conventional circuit shown in FIG. 1.

FIG. 2 shows operational timings in the case where the memory cell designated by $MC_{11}$ connected to the word lines $WL_{11}$ is selected.

Now, an explanation is made on a signal amplifying operation of the sense amplifier 2 in the case where the data of a low level is stored in the memory cell $MC_{11}$.

In FIG. 2, $V_{CC}$ represents the power supply voltage (high level). The precharge voltage $V_{PRE}$ is a predetermined voltage satisfying the relation $0 \leq V_{PRE} \leq V_{CC}$. Generally, this precharge voltage is $V_{PRE} = V_{CC}/2$.

During the standby state of the memory, the input-output terminals SA1, SA2, the bit lines $BL_1$, $BL_2$, and the activating signals SAP, SAN are all set to the level of the precharge voltage $V_{PRE}$. The transfer signal TSx is in its high level with the bit line $BL_1$ and the input-output terminal SA1 and also the bit line $BL_2$ and the input-output terminal SA2 respectively being in their conductive states or electrically connected. The word lines $WL_{11} \sim WL_{1N}$ and $WL_{21} \sim WL_{2N}$ are all in their low level so that the switching transistors $Q_S$ of each of the memory cell is non-conductive.

First, the precharge signal PBL is rendered to a low level so that the transistors Q1~Q3 precharging the respective elements are made non-conductive. This state corresponds to the time period (a) shown in FIG. 2.

In order to read out the data from the selected memory cell $MC_{11}$, the word line $WL_{11}$ are rendered to be a high level (while other word lines remain at a low level) and the switching transistor $Q_S$ of the selected memory cell $MC_{11}$ is rendered to be conductive whereby the data is read out on the bit lines $BL_1$ and the input-output terminal SA1. Specifically, since the low level data is stored in the memory cell $MC_{11}$, the voltage of the bit line $BL_1$ and the input-output terminal SA1 slightly drops from the precharge voltage $V_{PRE}$ when the switching transistor $Q_S$ turns conductive. When the amount of voltage thus dropped is represented by $\Delta V$, the potential of the bit line $BL_1$ and the input-output terminal SA1 will be ($V_{PRE} - \Delta V$). The $\Delta V$ is hereinafter called a read-out voltage from the memory cell. The voltage of the bit line $BL_2$ and the input-output terminal SA2 remains unchanged from the precharge voltage $V_{PRE}$. The state just explained corresponds the time period (b) shown in FIG. 2.

Next, the transfer signal TSx is rendered to a low level so that the transfer gates TG1 and TG2 are rendered to be non-conductive whereby the sense amplifier 2 is disconnected from the bit lines $BL_1$ and $BL_2$. This state corresponds to the time period (c) shown in FIG. 2.

Thereafter, the activating signal SAN is caused to be a low level and the activating signal SAP is caused to be a high level whereby the sense amplifier 2 is activated and the read-out voltage $\Delta V$ is amplified. The amplifying operation of the sense amplifier 2 continues until the levels of the input-output terminals SA2 and SA1 respectively reach the levels of 0 V and the power supply voltage $V_{CC}$. This state corresponds to the time period (d) shown in FIG. 2.

After the sense amplifier 2 has completed amplification of the read-out voltage $\Delta V$, the transfer signal TSx are rendered to be a high level so that the transfer gates TG1 and TG2 become conductive, whereby the input-output terminal SA1 and the bit line $BL_1$ and also the input-output terminal SA2 and the bit line $BL_2$ are respectively connected. After the voltages of the input-output terminal SA1 and SA2 are transferred to the bit lines $BL_1$ and $BL_2$, the word line $WL_{11}$ of the selected level is rendered to be a low level. Thus, the re-writing of data into the memory cell $MC_{11}$ is performed. This state corresponds to the time period (e) shown in FIG. 2.

Since the sense amplifier 2 operates according to the procedures as explained above, it is possible to reduce the bit line capacitance at sense amplifying operation and to carry out the amplifying operation at a high speed.

However, there are problems in the conventional semi-conductor memory circuit explained above. That is, when the transfer signal TSx changes from its high level to its low level thereby causing the transfer gates TG1 and TG2 to become non-conductive, the effective read-out voltage $\Delta V$ inevitably becomes small due to the coupling noise occurred between the gate capacitances of these transfer gates and the parasitic capacitances C1~C4.

Now, the loss of the read-out voltage due to the coupling noise is considered.

It is assumed that there are variations in the parasitic capacitances C1~C4 as follows:

$$C1 = C_{SA} + \Delta C_{SA} \quad (1)$$
$$C2 = C_{SA} - \Delta C_{SA}$$
$$C3 = C_B + \Delta C_B$$

-continued $$C4 = C_B - \Delta C_B$$

In practice, since the variations in the values of the parasitic capacitances occur in the course of the manufacturing of LSI circuit, it is necessary to take into account approximately 5~10% as values of $\Delta C_{SA}/C_{SA}$ and $\Delta C_B/C_B$.

Here, due to the coupling noise which occurs when the transfer signal TSx is rendered to its low level, it is assumed that the voltage at the input-output terminal SA1 dropped by the amount of $\Delta V_1$ and the voltage at the input-output terminal SA2 dropped by the amount of $\Delta V_2$. Under the condition of the above equations (1), since C1 is larger than C2, that is, C1>C2, it follows that the relationship between variations of the read-out voltages will be $\Delta V_1 < \Delta V_2$.

Thus, the effective read-out voltage $\Delta V_{eff}$ after the voltage loss due to the coupling noise has taken place may be calculated as follows:

$$\Delta V_{eff} = (V_{PRE} - \Delta V_2) - (V_{PRE} - \Delta V - \Delta V_1) \quad (2)$$
$$= \Delta V - (\Delta V_2 - \Delta V_1) < \Delta V.$$

The above equation (2) indicates that the signal voltage is reduced due to the coupling noise.

Now, some embodiments according to the present invention are explained with reference to the accompanying drawings.

Figure 3:
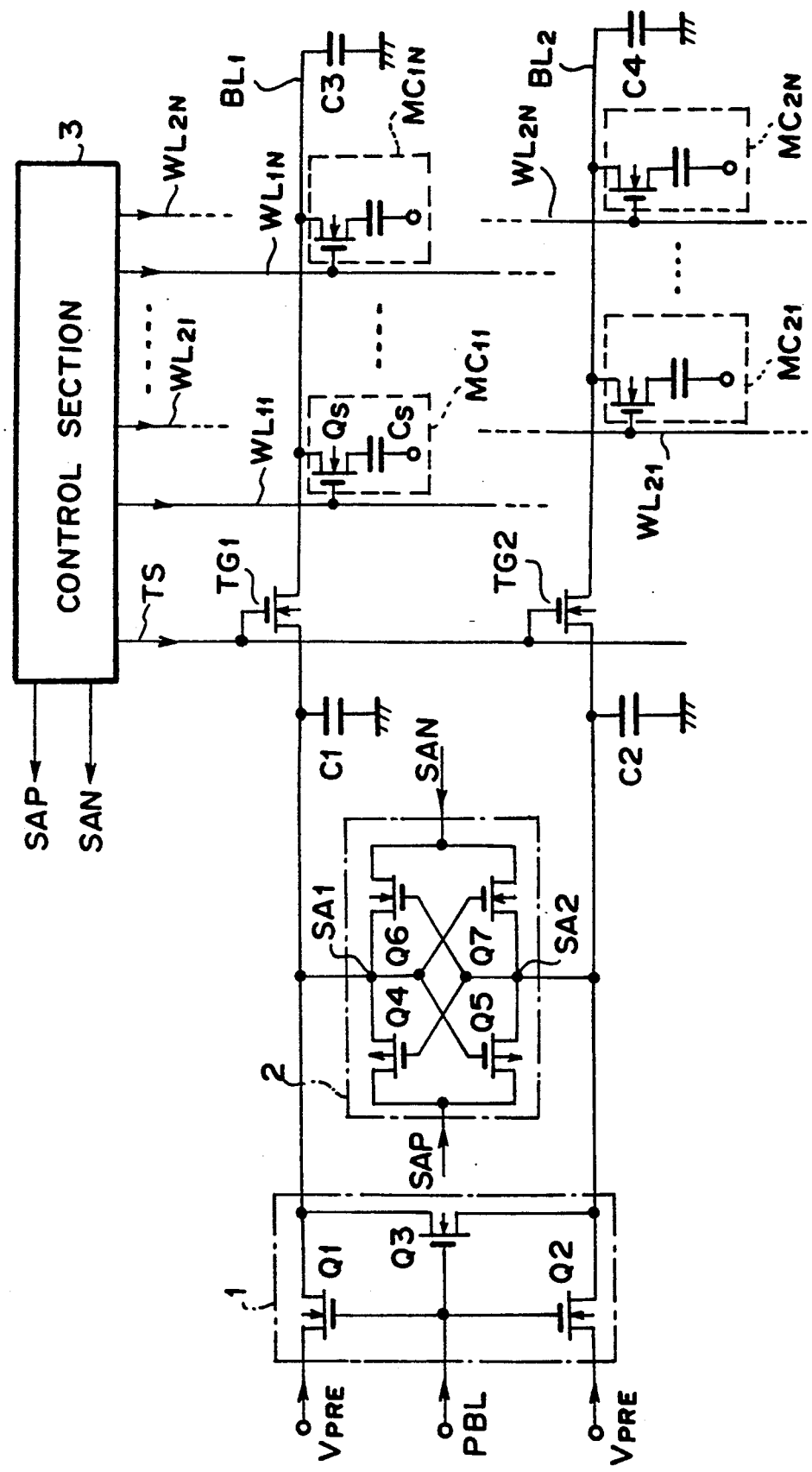
FIG. 3 is a circuit diagram showing a circuit of a first embodiment according to the present invention.

FIG. 3 diagrammatically shows a first embodiment of the semiconductor memory circuit according to the present invention.

The difference in this embodiment from the conventional semiconductor memory circuit illustrated in FIG. 1 resides in the following point. That is, after the precharge signal PBL has changed from its high level of an active level to its low level of a non-active level, the transfer signal TS is caused to change its level to high level which is an active level thereby turning the transfer gates TG1 and TG2 to their ON-states. After the transfer signal TS has changed to its high level, a predetermined word line (for example, $WL_{11}$) out of the word lines $WL_{11} \sim WL_{1N}$, $WL_{21} \sim WL_{2N}$ is changed to its high level of a selecting level whereby the memory cell ($MC_{11}$) is selected and, after the predetermined word line ($WL_{11}$) has changed to its high level, the transfer signal TS is made a low level thereby causing the transfer gates TG1, TG2 to turn their OFF-states and, after the transfer signal TS has changed to its low level, the activating signals SAP, SAN turn their levels to active levels whereby the sense amplifier is activated.

Next, the operation of the circuit according to this embodiment is explained.

Figure 4:
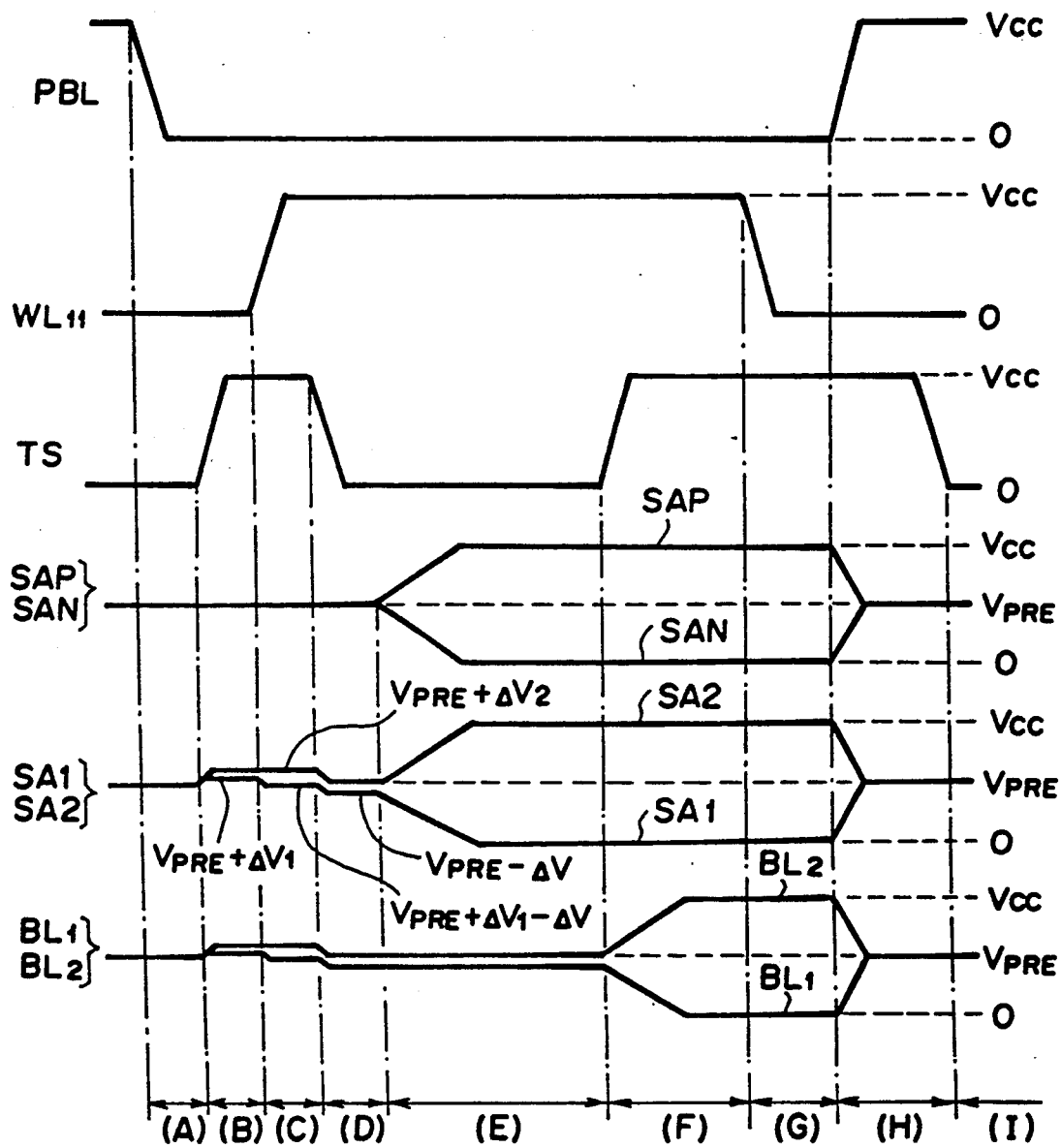
FIG. 4 is a timing chart showing various signal waveforms for illustrating the operation of the circuit shown in FIG. 3.

FIG. 4 is a timing chart showing various signal waveforms for illustrating the operation of the circuit according to this embodiment. The variations of the parasitic capacitances $C_1 \sim C_4$ are on the conditions as given by the equations (1).

(1) First, during the standby state of the memory circuit, the precharge signal PBL is at its high level so that the transistors Q1~Q3 are at their conductive states. The transfer signal TS is a low level so that the transfer gates TG1 and TG2 are in their non-conductive states, respectively. This is the first point which is different from the semiconductor memory circuit of the prior art.

(2) When data is to be read out from the memory cell (for example, $MC_{11}$), first, the precharge signal PBL is rendered to its low level so that the respective transistors Q1~Q3 are non-conductive and such elements as the sense amplifier 2 are cut-off from the precharge voltage $V_{PRE}$. This state corresponds to the period indicated by (A) in FIG. 4.

(3) The transfer signal TS is then rendered to its high level so that the transfer gates TG1 and TG2 become conductive. At this time, due to the coupling noise occurring between the gate capacitances of the transfer gates TG1, TG2 and the parasitic capacitances C1~C4, the voltage at the input-output terminal SA1 and the bit line $BL_1$ and the voltage at the input-output terminal SA2 and the bit line $BL_2$ respectively change to $(V_{PRE}+\Delta V_1)$ and $(V_{PRE}+\Delta V_2)$. This state corresponds to the period indicated by (B) in FIG. 4.

(4) The word line ($WL_{11}$) is then rendered to its high level and the read-out voltage $\Delta V$ is transferred from the memory cell ($MC_{11}$) onto the bit line $BL_1$ and the input-output terminal SA1. As a result, the voltages at the bit line $BL_1$ and the input-output terminal SA1 will become $(V_{PRE}+\Delta V_1-\Delta V)$. This state corresponds to the period indicated by (C) in FIG. 4.

(5) The transfer signal TS is then rendered to its low level thereby causing the transfer gates TG1 and TG2 to become non-conductive, so that the bit lines $BL_1$ and $BL_2$ are electrically separated from the sense amplifier 2. At this time, due to the coupling noise, the voltage at the input-output terminal SA1 and the bit line $BL_1$ drops by the amount of $\Delta V_1$ and the voltage at the input-output terminal SA2 and the bit line $BL_2$ drops by the amount of $\Delta V_2$ and, as a result, the voltage will become $V_{PRE}$ and $(V_{PRE}-\Delta V)$, respectively. This means that the problem of the read-out voltage loss due to the coupling noise which was the case in the conventional circuit has been eliminated. This state corresponds to the period indicated by (D) in FIG. 4.

(6) Here, the activating signals SAP and SAN are respectively rendered to be a high level and a low level so that the sense amplifier 2 is activated thereby amplifying the read-out voltage. The amplifying operation of the sense amplifier 2 continues until the voltages at the input-output terminals SA2 and SA1 reach respectively the levels of the power supply voltage $V_{CC}$ and the voltage 0 V. This state corresponds to the period indicated by (E) in FIG. 4.

(7) When the sense amplifier 2 has completed the amplifying operation, the re-writing of the data into the select memory ($MC_{11}$) takes place and, for this purpose, the transfer signal TS is rendered to be its high level thereby causing the transfer gates TG1 and TG2 to become conductive and the input-output terminal SA1 and the bit line $BL_1$, the input-output terminal SA2 and the bit line $BL_2$ to be connected, respectively, whereby the voltages at the input-output terminals SA1 and SA2 are respectively transmitted to the bit lines $BL_1$ and $BL_2$. This state corresponds to the period indicated by (F) in FIG. 4. Thereafter the word line ($WL_{11}$) is rendered to be its low level and the re-writing into the memory cell ($MC_{11}$) is thus completed. This state corresponds to the period indicated by (G) in FIG. 4.

(8) Next, the precharge signal PBL is rendered to be its high level so that the transistors Q1~Q3 are all conductive. Accordingly, all the terminals of, for example, the sense amplifier 2 are precharged to the level of the precharge voltage $V_{PRE}$. This state corresponds to the period indicated by (H) in FIG. 4.

(9) The transfer signal TS is rendered to be its low level bringing the state of the memory circuit to a memory standby state. This state corresponds to the period indicated by (I) in FIG. 4.

The feature of the invention resides in the point that the coupling noise occurring when the transfer signal TS changes from its low level to its high level in the above operational step (3) and the coupling noise occurring when the transfer signal TS change from its high level to its low level in the above operational step (5) cancel each other, which means that any influence caused by the coupling noise has been completely eliminated.

Figure 5:
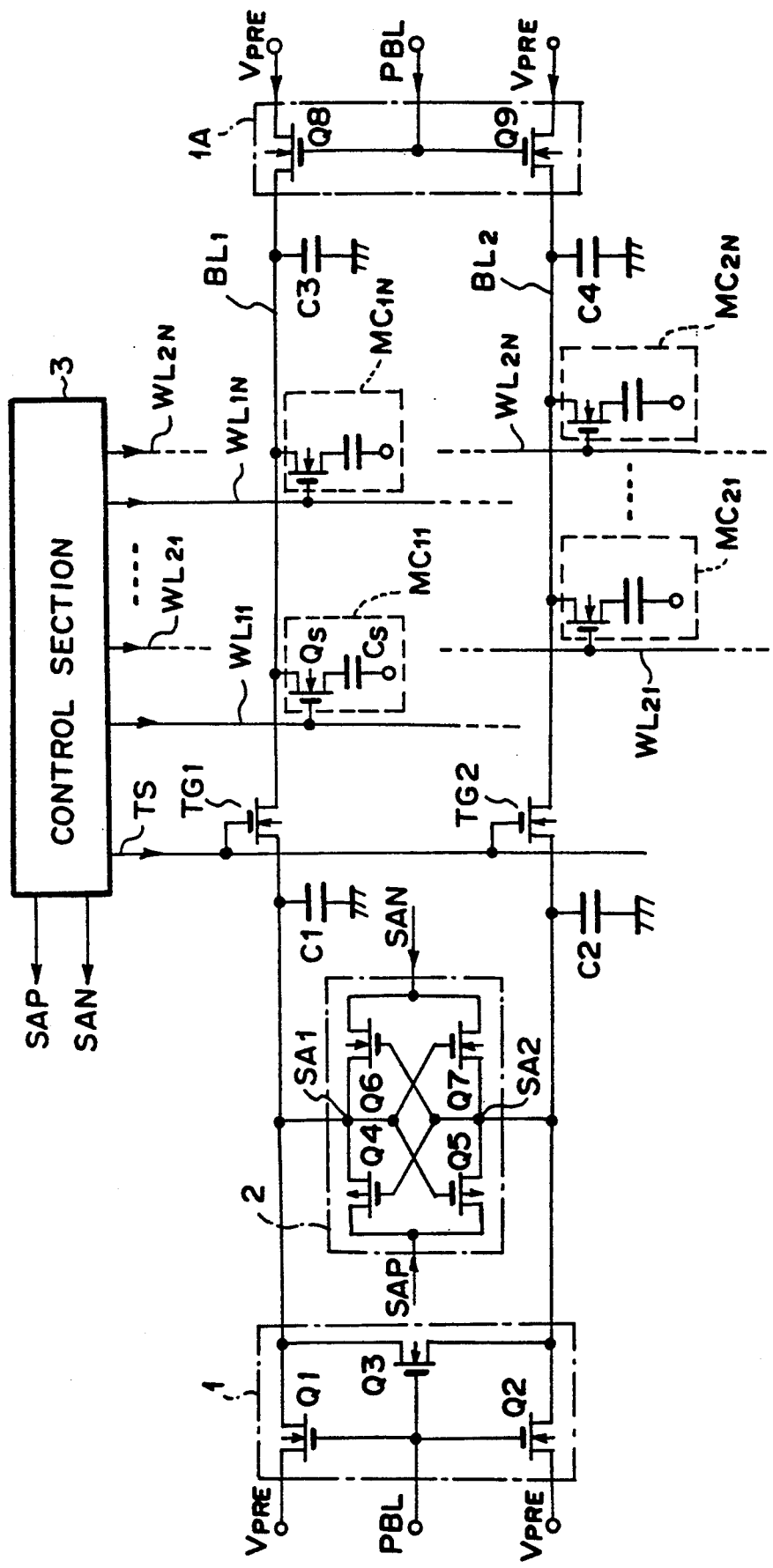
FIG. 5 is a circuit diagram showing a circuit of a second embodiment according to the present invention.

According to this embodiment of the invention, while the memory standby state, the transfer gates TG1 and TG2 are non-conductive so that the bit lines $BL_1$ and $BL_2$ are cut-off from the precharge voltage $V_{PRE}$ and, thus, are in a floating state. Under such state, in case the standby state is continued for a long period of time, there can be the possibility of the voltages of the bit lines $BL_1$ and $BL_2$ dropping due to leakage currents. FIG. 5 shows a second embodiment of the invention which is intended to avoid such a possibility just mentioned.

In the circuit of the second embodiment, there is added a precharge circuit $1_A$ which is constituted by transistors Q8 and Q9. This precharge circuit 1A applies the precharge voltage $V_{PRE}$ directly to the bit lines $BL_1$, $BL_2$. As for gate signals of the transistors Q8, Q9 of the precharge circuit $1_A$, the precharge signal PBL may be used.

As explained about, according to the present invention, under the memory standby state with the precharge signal being in its active state, the transfer signal is set to a non-active level. Entering into the memory access state, after the precharge signal has turned to its non-active level, the transfer signal is then changed to its active level and, subsequently, a predetermined word line is caused to be a selecting level and the data in the selected memory cell is transmitted to the bit line and, thereafter, the transfer signal is restored to its non-active level and the sense amplifier is activated. As the transfer signal is cause to change from its non-active level to its active level and from its active to its non-active level before and after the memory cell is set to its selecting state, it is possible to effectively eliminate any influence due to the coupling noise, to prevent the read-out voltage from being lost and to increase the operational tolerance or margin without affecting a high speed operation.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A semiconductor memory circuit comprising:
a first bit line and a second bit line;
a plurality of first word lines and a plurality of second word lines;
a plurality of first memory cells which are respectively connected to said first word lines and said first bit line and which communicate memory data with said first bit line when said first word lines are of a selecting level;
a plurality of second memory cells which are respectively connected to said second word lines and said second bit line and which communicate memory data with said second bit line when said second word lines are of a selecting level;
a first transfer gate and a second transfer gate whose each one end is correspondingly connected to each of said first bit line and said second bit line and which are switched ON and OFF in response to a transfer signal;
a sense amplifier whose first and second input-output terminals are respectively and correspondingly connected to the other ends of said first and second transfer gates and which are activated for amplifying signals between said first and second input-output terminals when an activating signal is at an activate level;
a precharge circuit which precharges said first and second input-output terminals of the sense amplifier to a predetermined level when a precharge signal is at an active level; and
a control section which sets said transfer signal to its active level thereby turning said first and second transfer gates to their ON-states after said precharge signal has been changed from its active level to its non-active level, which sets a predetermined word line of said plurality of first and second word lines to its selecting level after said transfer signal has been changed to its active level, which sets said transfer signal to its non-active level thereby turning said first and second transfer gates to their OFF-states after said predetermined word line has been changed to its selecting level, and which sets said activating signal to its active level after said transfer signal has been changed to its non-active level.

2. A semiconductor memory circuit according to claim 1, which further comprises another precharge circuit which includes transistors having gates receiving said precharge signal and which applies a precharge voltage directly to said first and second bit lines.

* * * * *